United States Patent
Francisco et al.

(10) Patent No.: US 11,506,621 B2
(45) Date of Patent: Nov. 22, 2022

(54) SYSTEM AND METHOD FOR MULTI-POINT THERMAL PATH ASSESSMENT

(71) Applicant: DELPHI TECHNOLOGIES IP LIMITED, St. Michael (BB)

(72) Inventors: Gregg N. Francisco, Cicero, IN (US); Kevin M. Gertiser, Carmel, IN (US); Jack L. Glenn, Union Pier, MI (US); Narendra J. Mane, Kokomo, IN (US); Thomas E. Pritchett, Clarksburg, MD (US); Soumyajit Routh, Kokomo, IN (US); Kok Wee Yeo, Singapore (SG)

(73) Assignee: DELPHI TECHNOLOGIES IP LIMITED, St. Michael (BB)

( * ) Notice: Subject to any disclaimer, the term of this patent is extended or adjusted under 35 U.S.C. 154(b) by 536 days.

(21) Appl. No.: 16/290,171

(22) Filed: Mar. 1, 2019

(65) Prior Publication Data

US 2020/0278309 A1    Sep. 3, 2020

(51) Int. Cl.
*G01N 25/18* (2006.01)
*G01N 25/00* (2006.01)

(52) U.S. Cl.
CPC .......... *G01N 25/18* (2013.01); *G01N 25/005* (2013.01)

(58) Field of Classification Search
None
See application file for complete search history.

(56) References Cited

U.S. PATENT DOCUMENTS 4,988,202 A    1/1991 Nayar et al.
5,575,417 A  * 11/1996 Allison .................. B23K 1/018
                                                  228/119

(Continued)

FOREIGN PATENT DOCUMENTS

CN    101776720 A    7/2010

OTHER PUBLICATIONS

Cheng et al., Theoretical and Experimental Characterization Of Heat Dissipation In A Board-Level Microelectronic Component, Science Direct Applied Thermal Engineering, May 10, 2007, pp. 575-588.

(Continued)

*Primary Examiner* — Erica S Lin
(74) *Attorney, Agent, or Firm* — Joshua M. Haines; Bookoff McAndrews, PLLC

(57) ABSTRACT

A method for assessing a thermal path associated with an integrated circuit includes identifying a heat application mode based on a design type of the integrated circuit. The method also includes measuring a first temperature of at least one thermal sensing device associated with the integrated circuit. The method also includes applying heat to at least a portion of the integrated circuit according to the heat application mode. The method also includes measuring a second temperature of the at least one thermal sensing device. The method also includes determining a difference between the first temperature and the second temperature. The method also includes determining whether a thermal path between the integrated circuit and an associated substrate is sufficient based on a comparison of the difference between the first temperature and the second temperature with a predetermined difference between an initial temperature and a subsequent temperature of the at least one thermal sensing device.

20 Claims, 10 Drawing Sheets

(56) References Cited

U.S. PATENT DOCUMENTS

| | | | |
|---|---|---|---|
| 6,891,967 B2 | 5/2005 | Prince | |
| 6,956,390 B1* | 10/2005 | Feltner | G01R 1/0458 |
| | | | 324/750.03 |
| 8,669,777 B2 | 3/2014 | Kuah et al. | |
| 2003/0034848 A1* | 2/2003 | Norman | H03K 3/0315 |
| | | | 331/46 |
| 2005/0124147 A1* | 6/2005 | Shiu | H01L 24/06 |
| | | | 438/613 |
| 2005/0189957 A1* | 9/2005 | Lopez | G01K 1/16 |
| | | | 324/750.03 |
| 2006/0156080 A1 | 7/2006 | Tellkamp et al. | |
| 2008/0013598 A1 | 1/2008 | Perotti et al. | |
| 2008/0103724 A1 | 5/2008 | Bashir et al. | |
| 2014/0137645 A1* | 5/2014 | Villella | G01F 23/22 |
| | | | 73/295 |
| 2015/0370937 A1 | 12/2015 | Liu et al. | |

OTHER PUBLICATIONS

Altet et al., Thermal Coupling in Integrated Circuits: Application to Thermal Testing, IEEE Journal Of Solid-State Circuits, Jan. 2001, pp. 81-91, vol. 36 No. 1.

Eveloy et al., Prediction of Electronic Component-Board Transient Conjugate Heat Transfer, IEEE Transactions on Components and Packaging Technologies, Dec. 2005, pp. 817-829, vol. 28 No. 4.

\* cited by examiner

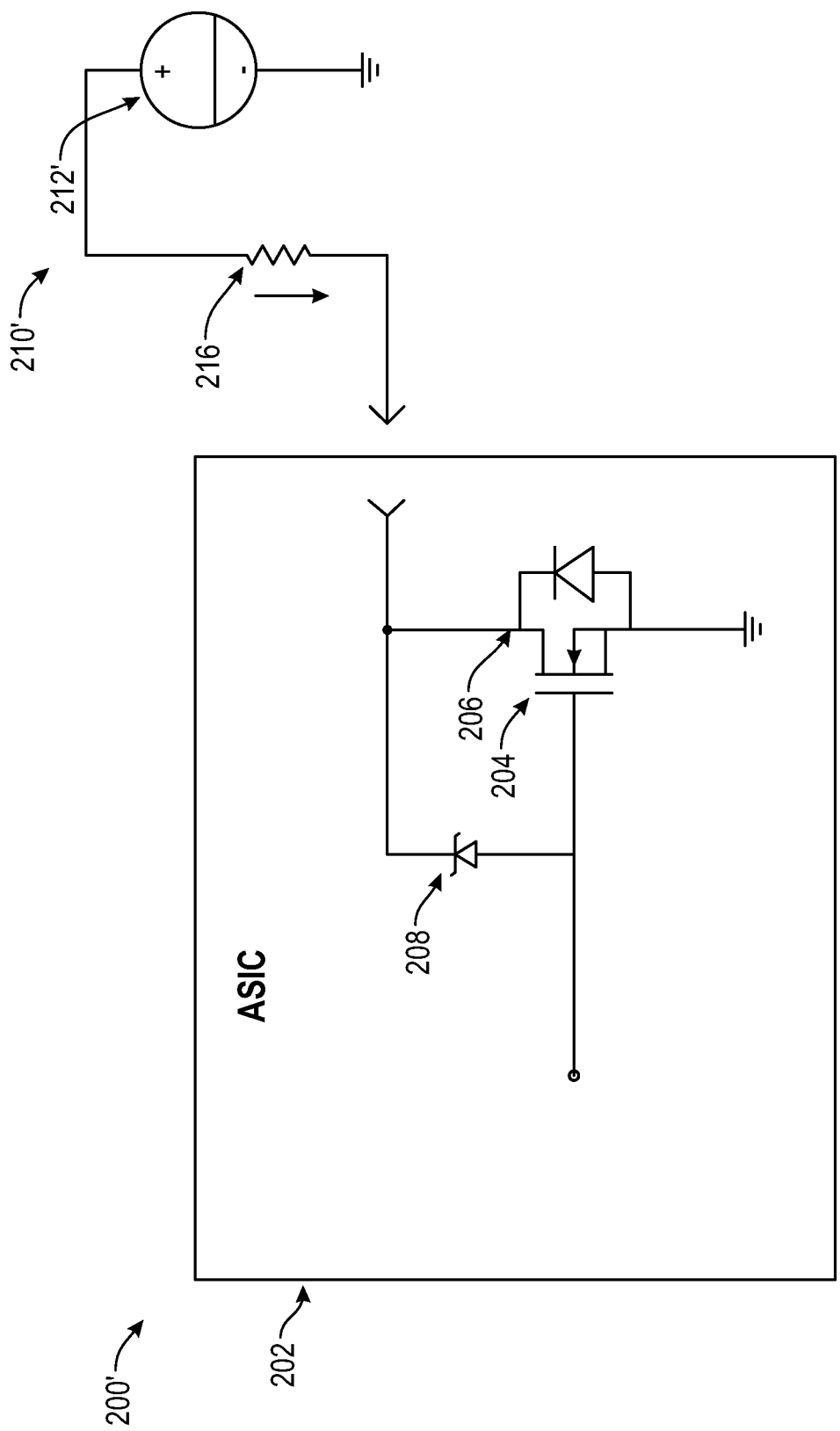

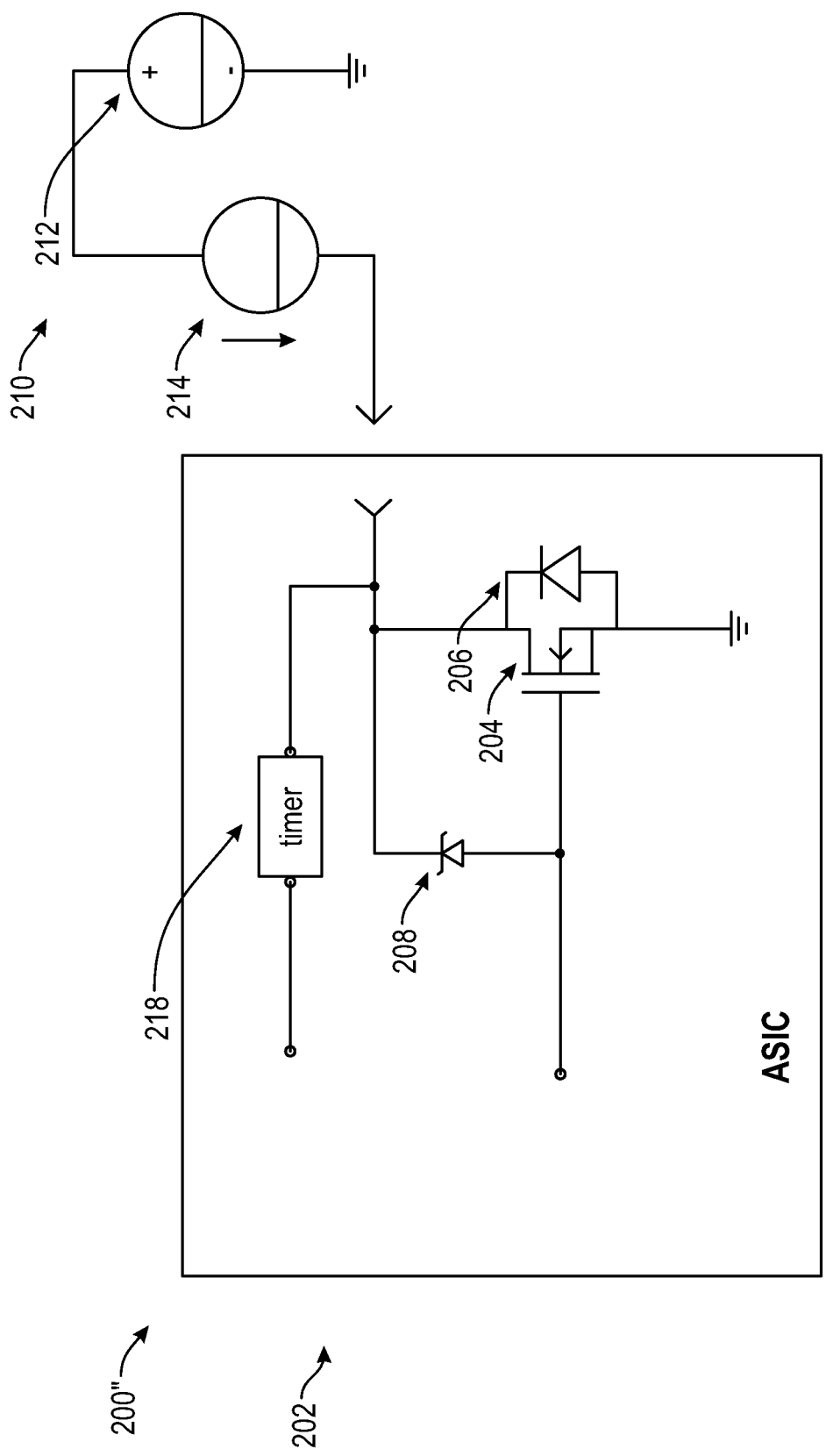

SYSTEM AND METHOD FOR MULTI-POINT THERMAL PATH ASSESSMENT

TECHNICAL FIELD

This disclosure relates to integrated circuits, and in particular, to systems and methods for multi-point thermal path assessment of integrated circuits.

BACKGROUND

Integrated circuits (IC), such as analog signal ICs, digital signal ICs, or mixed signal ICs, typically comprise a set of electronic components, such as transistors or other suitable components, inseparably integrated on a relatively small portion of semiconductor material (e.g., silicon or other suitable material). Modern IC s may integrate millions or billions of electronic components and may be used in various applications, such as desktop computers, laptop computers, mobile computing devices, tablet computing devices, home appliances, stereos, medical devices, and a plurality of other electronic devices.

In such applications, an IC is typically connected, using solder or other thermally conductive material, to a printed circuit board (PCB) substrate, which electrically connects other ICs and electronic components on the PCB. Typically, solder and flux (e.g., a paste that promotes solder flow) are applied to the PCB (e.g., using a dipping process or other suitable manufacturing process) to secure and electrically connect the IC, and other electronic components, to the PCB (e.g., typically referred to as a PCB assembly (PCBA) when the ICs and electronic components are secured and electrically connected to the PCB).

During manufacturing of PCBAs, the thermal paths (e.g., solder connections connecting the IC to the substrate of the PCB and/or thermal interface material between the PCB and a pedestal of the PCBA) and/or system level thermal performance of the PCBA may be verified using, for example, X-ray screening processes. However, as power demand in ICs increases, accurate verification of thermal paths and/or the system level thermal performance of the PCBA has become increasingly more difficult.

SUMMARY

This disclosure relates generally to integrated circuit thermal path assessment systems and methods.

An aspect of the disclosed embodiments is a method for assessing a thermal path associated with an integrated circuit. The method includes identifying a heat application mode based on a design type of the integrated circuit. The method also includes measuring a first temperature of at least one thermal sensing device associated with the integrated circuit. The method also includes applying heat to at least a portion of the integrated circuit according to the heat application mode. The method also includes measuring a second temperature of the at least one thermal sensing device associated with the integrated circuit. The method also includes determining a difference between the first temperature and the second temperature. The method also includes determining whether a thermal path between the integrated circuit and an associated substrate is sufficient based on a comparison of the difference between the first temperature and the second temperature with a predetermined difference between an initial temperature and a subsequent temperature of the at least one thermal sensing device.

Another aspect of the disclosed embodiments is an integrated circuit thermal path assessment system. The system includes an integrated circuit, at least one thermal sensing device, and a controller. The integrated circuit is thermally attached to at least one substrate of a printed circuit board. The at least one thermal sensing device is associated with the integrated circuit. The controller is in communication with integrated circuit and configured to: identify a heat application mode based on a design type of the integrated circuit; measure a first temperature of at least one thermal sensing device associated with the integrated circuit; apply heat to at least a portion of the integrated circuit according to the heat application mode; measure a second temperature of the at least one thermal sensing device associated with the integrated circuit; determine a difference between the first temperature and the second temperature; and determine whether a thermal path associated with the integrated circuit is sufficient based on a comparison of the difference between the first temperature and the second temperature with a predetermined difference between an initial temperature and a subsequent temperature of the at least one thermal sensing device.

Another aspect of the disclosed embodiments is a method for characterizing a first integrated circuit. The method includes measuring an initial temperature of at least a portion of the first integrated circuit. The method also includes applying heat to at least a portion of the first integrated circuit according to at least one heat application mode of a plurality of heat application modes. The method also includes measuring a subsequent temperature of the portion of the first integrated circuit. The method also includes defining a thermal relationship of at least one thermal path between the first integrated circuit and a substrate of a printed circuit board, a location of at least one thermal sensing device on the first integrated circuit, and at least one heat application mode of the plurality of heat application modes.

Another aspect of the disclosed embodiments is a thermal path assessment system. The system includes an integrated circuit, at least one thermal sensing device, a case or heat sink, and a controller. The integrated circuit is thermally attached to at least one substrate of the printed circuit board. The printed circuit board is attached to the case or heat sink with thermal glue or other thermally conductive material. The at least one thermal sensing device is associated with the integrated circuit. The controller is in communication with the integrated circuit and configured to: identify a heat application mode based on a design type of the integrated circuit; measure a first temperature of at least one thermal sensing device associated with the integrated circuit; apply heat to at least a portion of the integrated circuit according to the heat application mode; measure a second temperature of at least one thermal sensing device associated with the integrated circuit; determine a difference between the first temperature and the second temperature; and determine whether the thermal path between the integrated circuit and an associated case or heat sink is sufficient based on a comparison of the difference between the first temperature and the second temperature with a predetermined difference between an initial temperature and a subsequent temperature of at least one thermal sensing device.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 2B generally illustrates an alternative heat application mode according to the principles of the present disclosure.

FIG. 2C generally illustrates an alternative heat application mode according to the principles of the present disclosure.

DETAILED DESCRIPTION

Figure 1A:
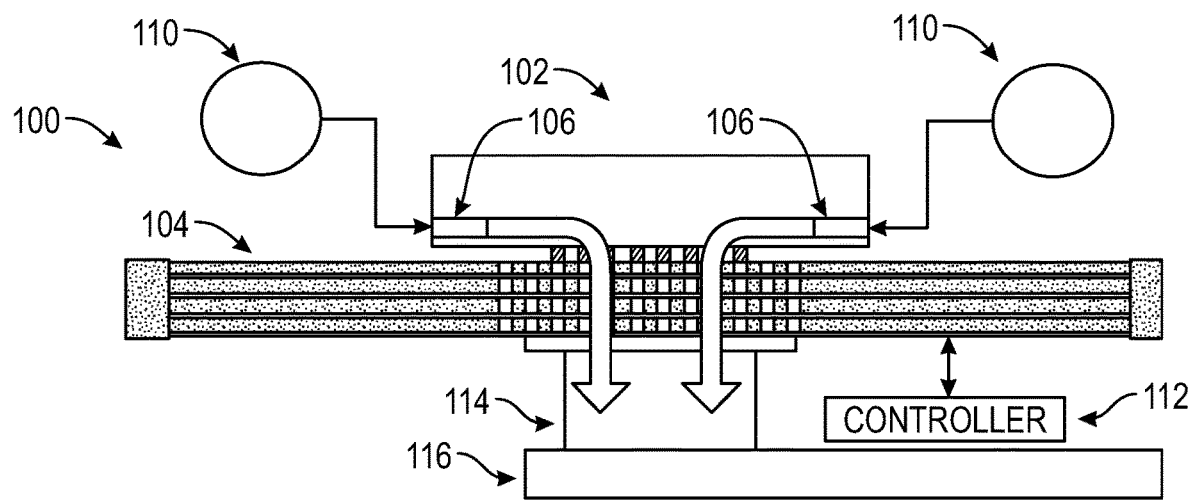
FIGS. 1A and 1B generally illustrate a printed circuit board assembly according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, integrated circuits (IC), such as analog signal ICs, digital signal ICs, or mixed signal ICs, typically comprise a set of electronic components, such as transistors or other suitable components, inseparably integrated on a relatively small portion of semiconductor material (e.g., silicon or other suitable material). ICs may include microprocessors, microcontrollers, memory chips, application-specific integrated circuits (ASICs), field-programmable gate arrays (FPGAs), sensors, power management circuits, operation amplifiers, analog-to-digital converters, digital-to-analog converters, and the like. Modern ICs may integrate millions or billions of electronic components and may be used in various applications, such as desktop computers, laptop computers, mobile computing devices, tablet computing devices, home appliances, stereos, medical equipment, and a plurality of other electronic devices.

An IC is typically connected, using solder or other thermally conductive material, to a printed circuit board (PCB) substrate, which electrically connects other ICs and electronic components on the PCB. For example, one or more leads of the IC may be soldered (e.g., thermally attached) to the substrate to electrically connect the IC to the other ICs and electronic components on the PCB and/or to one another. The solder, such as a lead alloy solder or other suitable solder, provides a conductive path for electrons to flow to and from the IC via the substrate. Typically, solder and flux (e.g., a paste that promotes solder flow) are applied to the PCB (e.g., using a dipping process or other suitable manufacturing process) to secure and electrically connect the IC, and other electronic components, to the PCB (e.g., typically referred to as a PCB assembly (PCBA) when the ICs and electronic components are secured and electrically connected to the PCB).

During manufacturing of PCBAs, solder between ICs and/or other electronic components may be insufficiently applied, resulting in faulty solder connections. Faulty solder connections (e.g., solder voids or other faulty solder connection) are relatively common and degrade thermal interfaces (e.g., connections between ICs and/or other electronic components and the substrate). For example, under certain circumstances (e.g., increased thermal conditions resulting from high power being applied to the ICs and/or electronic components) in production (e.g., in a production environment, such as an end user environment, and the like) the solder connection between, for example, the IC and the substrate of the PCB may be inadequate (e.g., due to the insufficiently applied solder). This may cause the IC to overheat or enter thermal shutdown preventing the IC from interacting with other components on the PCB and/or other system components associated therewith. Such faulty solder connections may result from component tolerance issues, leadform stamping tolerances, solder printing tolerances, and the like and are often not detected in the production environment.

Accordingly, during the manufacturing process, the thermal paths (e.g., the solder connections connecting the IC to the substrate of the PCB and/or the thermal interface material between the PCB and a pedestal of the PCBA) and/or system level thermal performance of the PCBA may be inspected and/or verified. For example, X-ray screening processes, visual inspection processors, or other similar processes may be utilized to inspect and/or verify that solder connections of the PCBA are sufficient to allow ICs and/or other electronic components to electrically communicate with one another and to function properly in the production environment under.

However, as power demand in ICs increases, accurate verification of thermal paths and/or the system level thermal performance of the PCBA has become increasingly more difficult. For example, ICs are typically manufactured with a bottom side exposed thermal pad, which is thermally connected with solder or thermally conductive material to the substrate of the PCB. However, such an exposed thermal pad may make solder connection quality and/or thermal structure quality and performance difficult to ensure in a production environment. Additionally, or alternatively, X-ray and/or other screening processes may be subject to variance in user interpretation due to lack of contrast in images of the PCBA captured as part of the X-ray screening processes. Further, such processes are not a quantitative measurement, are subject to visual inspection, and may increase production costs of the ICs and PCBAs. Faulty solder connections and/or other thermal interface faults may not be detected during the manufacturing process, which may increase the likelihood that the PCBAs and/or components associated therewith may fail or have reduced reliability during use in the production environment.

Accordingly, systems and methods, such as those described herein, that verify integrity of system level thermal structure quality during production and that assess thermal characteristics (e.g., solder connections) during engineering development, may be desirable. In some embodiments, the systems and methods described herein may be configured to provide a multi-point thermal path assessment of thermal paths between ICs and substrates of a PCB, a bottom surface of the PCB and a pedestal or case of the PCBA, and the like.

FIG. 1A generally illustrates a printed circuit board assembly (PCBA) 100 according to the principles of the present disclosure. The PCBA 100 may be used in any suitable application, such as a desktop computer, a laptop computer, a mobile computing device, a tablet computing device, a home appliance, a stereo, a medical device, or any other suitable electrical device. Additionally, or alternatively, the PCBA 100 may interact with a plurality of other PCBAs.

The PCBA 100 includes an integrated circuit (IC) 102 and a printed circuit board (PCB) 104. The IC 102 may include a plurality of electrical components inseparably integrated and/or disposed on a segment of semiconductor material, such as silicon or other suitable semiconductor material. The IC 102 may comprise a microprocessor, a microcontroller, a memory chip, an application-specific integrated circuit (ASIC), a field-programmable gate array (FPGA), a sensor, a power management circuit, an operation amplifier, an analog-to-digital converter, a digital-to-analog converter, or other suitable IC. Additionally, or alternatively, the IC 102 may comprise an analog signal IC, a digital signal IC, or a mixed signal IC. The IC 102 may include an exposed pad disposed on a bottom surface of the IC 102 (e.g., a surface that faces the PCB 104). The exposed pad may include a plurality of leads adapted to be electrically connected to the PCB 104. For example, as described, thermal conductive material such as solder, may be applied between a respective lead and a portion of a substrate on the PCB 104. It should be understood that while only the IC 102 is described herein, the principles of the present disclosure apply to any number of ICs and any suitable electrical components.

The PCB 104 may be adapted to mechanically support the IC 102 and/or other ICs and electrical components and to electrically connect such components. The PCB 104 may include, as described, substrates, pads, and other features that may be etched into one or more layers of conductive material, such as copper or other suitable conductive material. The layers of conductive material of the PCB 104 may be laminated onto or sandwiched between layers of non-conductive material.

The PCBA 100 may include a pedestal (e.g., a heat sink) 114 and a PCBA case or housing 116. In some embodiments, the PCBA housing 116 may be configured to house or enclose the IC 402, PCB 404, and/or the pedestal 114. The pedestal 114 may be disposed on a side of the PCB 104 opposite the IC 102. The PCB 104 may be attached to the pedestal 114 using a suitable thermal interface material (e.g., thermal glue or other thermally conductive material). The pedestal 114 may include a heat sink configured to draw heat generated by the IC 102 away from the IC 102.

Figure 1B:
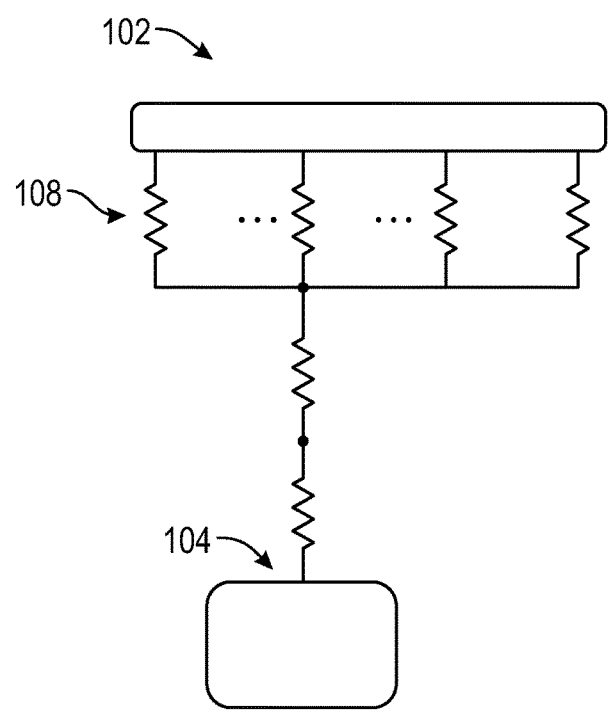

In some embodiments, the PCBA 100 includes one or more temperature sensing devices, such as one or more thermal sensing devices 106. The thermal sensing devices 106 may include any temperature-sensing device, such as thermal diodes or other suitable temperature sensing devices. The one or more thermal sensing devices 106 may be disposed within the IC 102 or external to the IC 102. In some embodiments, a thermal sensing device 106 may be disposed proximate to a corresponding heat zone of the IC 102. FIG. 1B generally illustrates a schematic of the PCBA 100 including a plurality of heat zones 108. While the PCBA 100 is illustrated with four heat zones 108, it should be understood that the PCBA 100 may include any suitable number of heat zones 108.

The PCBA 100 may include one or more power sources 110. The power sources 110 may include current sources, voltage sources, or other suitable power source. The power sources 110 may include a power circuit comprising a voltage source, one or more resistors, one or more capacitors, and/or one or more other suitable electrical components. In some embodiments, the PCBA 100 includes a high side power source 110 and a low side power source 110, however, the PCBA 100 may omit either of the high side power source 110 or the low side power source 110. When power (e.g., voltage and/or current) is supplied by one of the power sources 110, the power flows through the components of the IC 102 and into the substrate of the PCB 104 via the thermal connections between the IC 102 and the substrate of the PCB 104, which causes a temperature associated with each respective heat zone 108 to increase. The thermal sensing devices 106 associated with each respective heat zone 108 are adapted to sense and/or measure temperatures associated with the respective heat zones 108.

In some embodiments, the PCBA 100 may be in communication with a controller 112. For example, the controller 112 may include one or more leads that communicates via an interface, such as a serial peripheral interface, a controlled area network bus, an analog voltage output interface, or other suitable interface, of the PCBA 100. The controller 112 may include any suitable controller implemented in hardware, software, or a combination thereof, including, but not limited to, an onboard controller, an application running on a mobile computing device, an application running on a desktop or laptop computer, or other suitable controller. The temperatures measured by thermal sensing devices 106 are communicated via the interface to the controller 112. In some embodiments, the controller 112 may be housed within the PCBA housing 116 and/or disposed external to the PCBA housing 114.

In some embodiments, the controller 112 may be configured to characterize the IC 102 using the temperatures measured by thermal sensing devices 106. For example, during engineering of the IC 102, the controller 112 may monitor temperature increases of the heat zones 108 in response to various heat application modes, as will be described. The controller 112 determines an initial temperature of the IC 102. For example, the controller 112 may receive or measure temperature measurements from one or more of the thermal sensing devices 106 prior to one of the power sources 110 supplying power to the IC 102. Receiving temperature measurements from the one or more thermal sensing devices 106 may include the controller 112 measuring temperatures of the one or more thermal sensing devices 106. For example, as will be described, the controller 112 may follow a temperature monitoring strategy that includes monitoring one or more than one of the thermal sensing devices 106. The controller 112 may determine an average temperature of the temperature measurements received or measured from the one or more thermal sensing devices 106.

The controller 112 may then select one of a plurality of heat application modes, as will be described, in order to supply power to the IC 102. The controller 112 supplies power to the IC 102 according to the selected heat application mode. The controller 112 receives or measures temperature measurements, according to the temperature monitoring strategy, from the one or more thermal sensing devices 106 after a predetermined period. The predetermined period may be any suitable period, such as 100 milliseconds, 200 milliseconds, or any suitable period. The controller 112 may determine an average temperature of the temperature measurements received or measured from the one or more thermal sensing devices 106. The controller 112 stores the average temperature as a subsequent temperature of the IC 102. In some embodiments, the controller 112 determines a plurality of subsequent temperatures for a plurality of periods after power is supplied to the IC 102.

The controller 112 determines a delta temperature corresponding to a change in temperature between the initial temperature of the IC 102 and the subsequent temperature of the IC 102 (e.g., after power is supplied to the IC 102 for the predetermined period). The delta temperature corresponds to an expected temperature change for the IC 102 using the selected heat application mode. The controller 112 stores the delta temperature in a register associated with the controller 112 and/or the IC 102.

The controller 112 may determine a relationship between the delta temperature, the selected heat application mode, an arrangement of the thermal sensing devices 106 relative to the heat zones 108, and the temperature monitoring strategy. For example, the controller 112 may determine that, for the IC 102, using the selected heat application mode, with the thermal sensing devices 106 arranged proximate the heat zones 108, and following the temperature monitoring strategy, the delta temperature is the expected temperature change between an initial temperature and a subsequent temperature measured after a predetermined period following application of power to the IC 102.

As will be described, in some embodiments, during manufacturing of PCBAs having ICs with a similar design to the IC 102, the ICs may be tested to verify sufficiency of thermal paths associated with the ICs. The ICs may be tested at in-circuit test, middle of the line, end of the line, at assembled unit testing, or a combination thereof. A thermal path associated with a respective IC may include solder connections between the IC and an associated PCB, a thermal interface between the PCB and an associated pedestal, a thermal interface between the PCB and the housing, a thermal interface between the IC and the pedestal, a thermal interface between the IC and the housing, and/or other suitable thermal interfaces or connections. For a respective IC, when a measured delta temperature is within a predetermined range (e.g., plus or minus one degree, or other suitable range) of the expected delta temperature, the thermal path associated with the IC (e.g., associated with the heat zones 108 that are tested for the IC) are determined to be sufficient. Conversely, for the respective IC, when the measured delta temperature is outside of the predetermined range of the expected delta temperature, the thermal path associated with the IC is determined to be intermediate or insufficient, depending on how far outside the predetermined range the measured delta temperature is. The PCBA may then be repaired in order to correct the insufficient thermal path.

Figure 5:
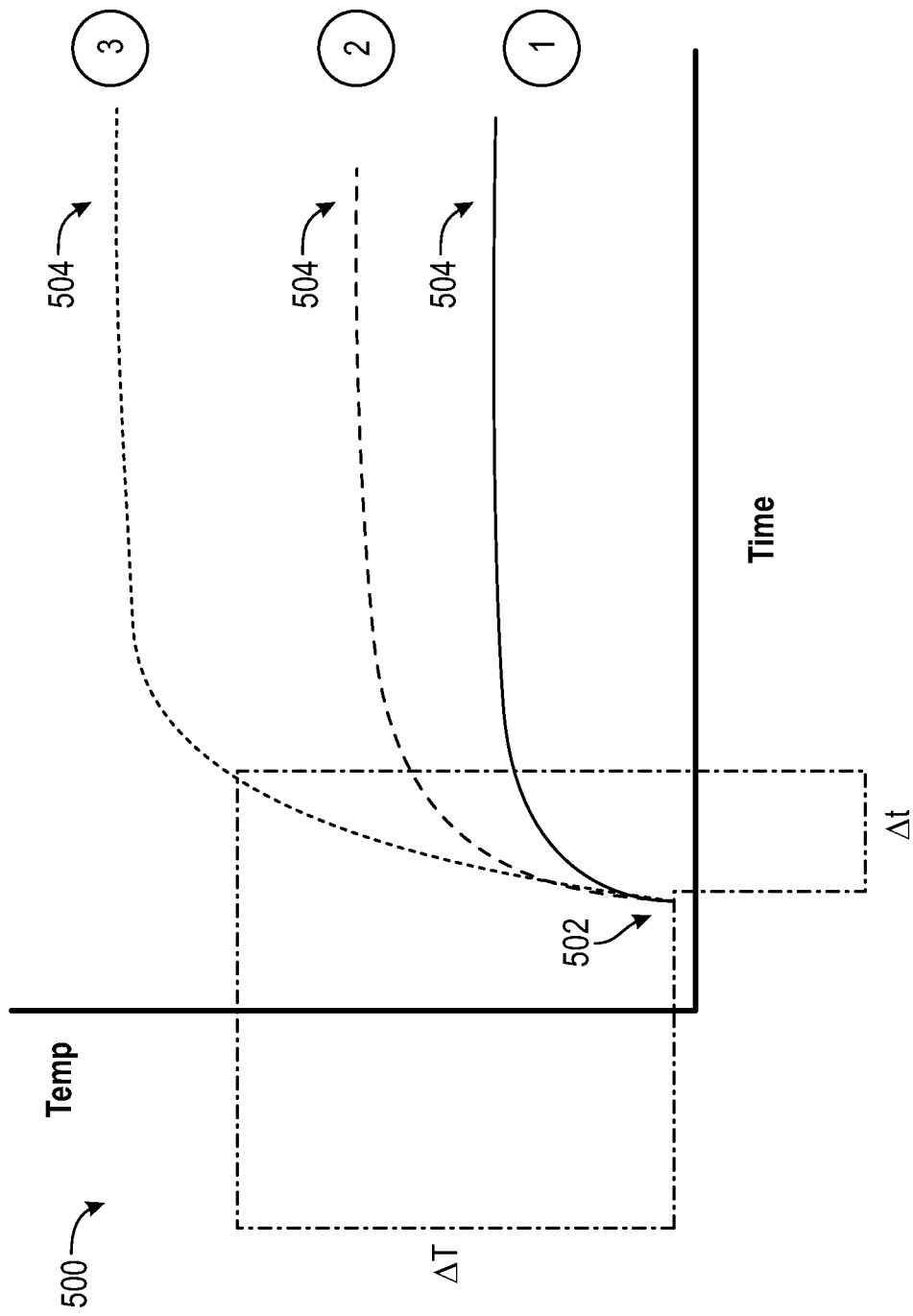
FIG. 5 generally illustrates a graphical representation of various thermal measurements according to the principles of the present disclosure.

FIG. 5 generally illustrates a chart 500 illustrating delta temperatures between initial temperature measurements 502 and subsequent measurements 504. Line 1 generally illustrates an expected delta temperature for an IC. Lines 2 and 3 illustrate measured delta temperatures for an IC having an intermediate thermal path (e.g., line 2) and insufficient thermal path (e.g., line 3).

In some embodiments, the controller 112 may select other heat application modes and determine corresponding expected delta temperatures for each respective heat application mode. Additionally, or alternatively, the controller 112 may follow other temperature monitoring strategies of a plurality of temperature monitoring strategies. For example, as will be described, a one temperature monitoring strategy may include monitoring one thermal sensing device 106 while another temperature monitoring strategy may include determining an average temperature from temperature measurements received or measured from all thermal sensing devices 106. In some embodiments, the controller 112 follows each temperature monitoring strategy for each heat application mode and determines relationships, as described, for each combination of temperature monitoring strategy and heat application mode.

The controller 112 may determine which combination of temperature monitoring strategy and heat application mode most accurately characterizes the IC 102. For example, the controller 112 may communicate with an automatic data processing (ADP) system to determine which combination of temperature monitoring strategy and heat application mode most accurately characterizes the IC 102. The initial temperature, the subsequent temperature, and/or the delta temperature associated with the combination of temperature monitoring strategy and heat application mode most accurately characterizes the IC 102 are stored as the expected initial temperature, the expected subsequent temperature, and the expected delta temperature in registers associated with ICs having a similar design type as the IC 102. During manufacturing of the PCBAs, as described, the expected initial temperature, the expected subsequent temperature, and/or the expected delta temperature stored in the registers of the ICs are used to test the ICs, as described.

Figure 2A:
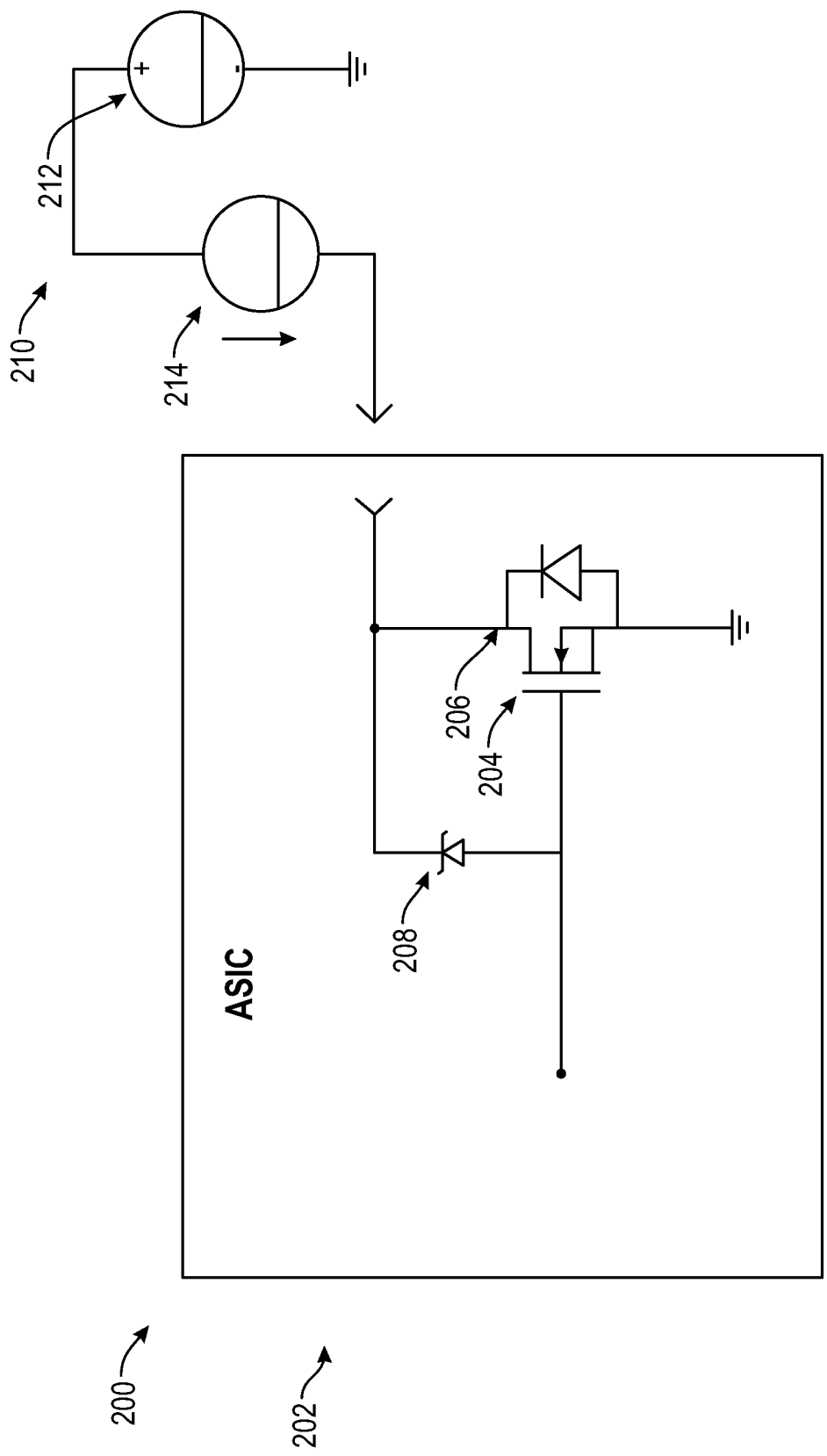
FIG. 2A generally illustrates a heat application mode according to the principles of the present disclosure.

FIG. 2A generally illustrates a heat application mode, such as a low error-heating mode 200 according to the principles of the present disclosure. The mode 200 may be referred to as a test mode of an IC 202 and may provide: accurate clamp voltage management; accurate current source management; and known power values. The mode 200 includes the IC 202 (e.g., comprising an ASIC) and a power source 210. The IC 202 may include a first circuit design type. The IC 202 includes a field-effect transistor (FET) 204 and a thermal sensing device 206 connected to ground on a low side of the FET 204 and the thermal sensing device 206 and connected to the power source 210 on a high side of the FET 204 and the thermal sensing device 206. The thermal sensing device 206 may include a thermal diode, as described. Additionally, the IC 202 includes a clamp 208 connected to the FET 204 on a low side of the clamp 208 and connected to the power source 210 on a high side of the clamp 208.

The mode 200 includes supplying power, using the power source 210, to the high side of the IC 202. The power source 210 may include a voltage source 212 and a current source 214. The voltage source 212 may be configured to provide a voltage value. For example, the voltage value may include 55 volts or substantially 55 volts. The current source 214 is configured to provide a current value. For example, the current value may include 10 milliamps or substantially 10 milliamps. As described, the controller 112 is configured to receive or measure, from the thermal sensing device 206, a temperature measurement before power is supplied to the IC 202 (e.g., the initial temperature). The controller 112 may then supply the power, using the power source 210, to the high side of the IC 202 and, after the predetermined period expires and/or in response to the clamp 208 opening, the controller 112 receives or measures another temperature measurement from the thermal sensing device 206 (e.g., the subsequent temperature).

FIG. 2B generally illustrates an alternative heat application mode 200' according to the principles of the present disclosure. The mode 200' may be referred to as a normal operation mode for the IC 202. The mode 200' includes the IC 202, as described, and an alternative power source 210'. The mode 200' includes supplying power, using the power source 210', to the high side of the IC 202. The power source 210' may include an alternative voltage source 212' and a resistor 216. The voltage source 212' may be configured to provide a voltage value. For example, the voltage value may include 7 volts or substantially 7 volts. The resistor 216 is configured to provide a resistance value. For example, the resistance value may include 10 ohms or substantially 10 ohms. As described, the controller 112 is configured to receive or measure, from the thermal sensing device 206, a temperature measurement before power is supplied to the IC 202 (e.g., the initial temperature). The controller 112 may then supply the power, using the power source 210, to the high side of the IC 202 and, after the predetermined period expires and/or in response to the clamp 208 opening, the controller 112 receives or measures another temperature measurement from the thermal sensing device 206 (e.g., the subsequent temperature).

FIG. 2C generally illustrates an alternative heat application mode, an internal timer heat application mode 200" according to the principles of the present disclosure. The mode 200" may be referred to as a test mode of the IC 202 and may provide: accurate clamp voltage management; accurate current source management; and known power values. The mode 200" includes the IC 202 and the power source 210. The IC 202 may include the first circuit design type, as described. For example, the IC 202 includes the FET 204 and the thermal sensing device 206 connected to ground on the low side of the FET 204 and the thermal sensing device 206 and connected to the power source 210 on the high side of the FET 204 and the thermal sensing device 206. Additionally, the IC 202 includes the clamp 208 connected to the FET 204 on the low side of the clamp 208 and connected to the power source 210 on the high side of the clamp 208. The IC 202 may further include a timer 218. The timer 218 may be connected to a voltage drain on one side of the timer 218 and a voltage output on another side of the timer 218. The timer 218 is configured to time a period corresponding to the predetermined period, as described, for measuring subsequent temperatures of the thermal sensing device 206. The timer 218 may begin timing the period in response to power being supplied, by the power source 210, to the IC 202. The timer 218 may stop timing when the timer 218 reaches an end of the period (e.g., 100 milliseconds, 200 milliseconds, or any suitable period). The controller 112, as described, may receive or measure a temperature measurement from one or more of the thermal sensing devices 206 in response to the timer 218 reaching the end of the period.

The mode 200" includes supplying power, using the power source 210, to the high side of the IC 202. The power source 210 may include the voltage source 212 and the current source 214. The voltage source 212 may be configured to provide a voltage value. For example, the voltage value may include 55 volts or substantially 55 volts. The current source 214 is configured to provide a current value. For example, the current value may include 10 milliamps or substantially 10 milliamps. As described, the controller 112 is configured to receive or measure, from the thermal sensing device 206, a temperature measurement before power is supplied to the IC 202 (e.g., the initial temperature). The controller 112 may then supply the power, using the power source 210, to the high side of the IC 202 and, after the predetermined period expires (e.g., in response to the timer 218 reaching the end of the period) and/or in response to the clamp 208 opening, the controller 112 receives or measures another temperature measurement from the thermal sensing device 206 (e.g., the subsequent temperature).

Figure 3A:
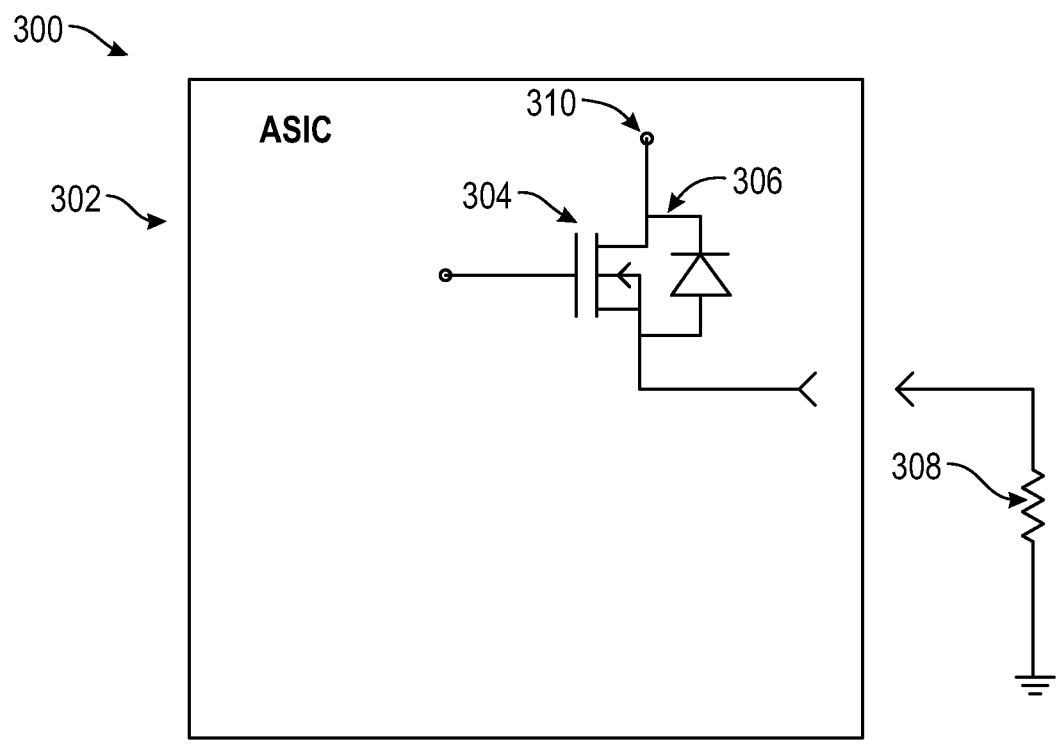
FIG. 3A generally illustrates an alternative heat application mode according to the principles of the present disclosure.

FIG. 3A generally illustrates an alternative heat application mode, such as a current limit mode 300 according to the principles of the present disclosure. The mode 300 includes an IC 302 (e.g., comprising an ASIC) and a power source 310. The IC 302 may include a second circuit design type. The IC 302 includes a FET 304 and a thermal sensing device 306 connected to a resistor 308 on a low side of the FET 304 and the thermal sensing device 306 and connected to the power source 310 on a high side of the FET 304 and the thermal sensing device 306. The thermal sensing device 306 may include a thermal diode, as described. The resistor 308 is disposed on a PCB external from the IC 302 and is connected to ground on a side of the resistor 308 opposite the FET 304 and the thermal sensing device 306. The resistor 308 is configured to provide a resistance value. The resistance value may be relatively low (e.g., 6.6 ohms or substantially 6.6 ohms) in order to force a current limit of the IC 302 to activate, which may result in a relatively large amount of power. The mode 300 may be referred to as a test mode of an IC 302 and may provide: accurate voltage measurement; and known power values using measurements of current through the resistor 308.

The mode 300 includes supplying power, using the power source 310, to the high side of the IC 302. The power source 310 may include a voltage source. The voltage source may be configured to provide a voltage value. For example, the voltage value may include 6 volts or substantially 6 volts. As described, the controller 112 is configured to receive or measure, from the thermal sensing device 306, a temperature measurement before power is supplied to the IC 302 (e.g., the initial temperature). The controller 112 may then supply the power, using the power source 310, to the high side of the IC 302 and, after the predetermined period, the controller 112 receives or measures another temperature measurement from the thermal sensing device 306 (e.g., the subsequent temperature).

Figure 3B:
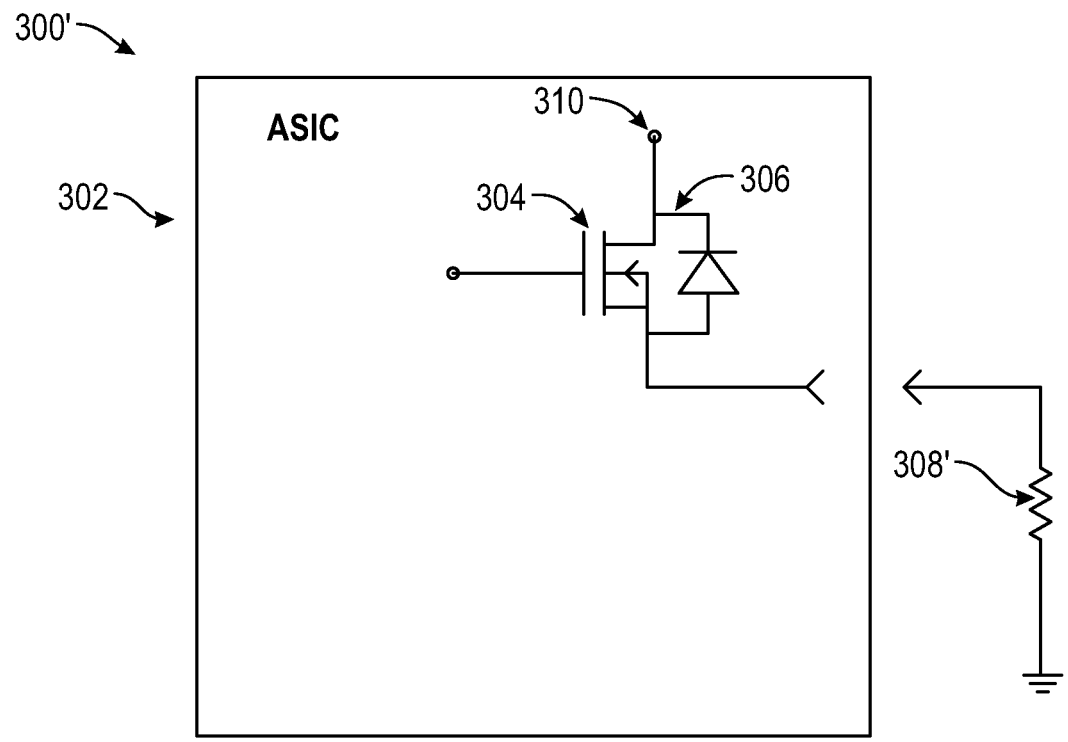
FIG. 3B generally illustrates an alternative heat application mode according to the principles of the present disclosure.

FIG. 3B generally illustrates an alternative heat application mode 300' according to the principles of the present disclosure. The mode 300' includes the IC 302 and the power source 310. The IC 302 includes the FET 304 and the thermal sensing device 306 connected to an alternative resistor 308' on the low side of the FET 304 and the thermal sensing device 306 and connected to the power source 310 on the high side of the FET 304 and the thermal sensing device 306. The thermal sensing device 306 may include a thermal diode, as described. The resistor 308' is disposed on a PCB external from the IC 302 and is connected to ground on the side of the resistor 308' opposite the FET 304 and the thermal sensing device 306. The resistor 308' is configured to provide a resistance value. The resistance value may be relatively higher than the resistor 308 of FIG. 3A (e.g., 16.67 ohms or substantially 16.67 ohms). The resistance value of the resistor 308' may be set for a rated current, which may result in a relatively small amount of power. The mode 300' may be referred to as a test mode of an IC 302.

The mode 300' includes supplying power, using the power source 310, to the high side of the IC 302. The power source 310 may include a voltage source. The voltage source may be configured to provide a voltage value. For example, the voltage value may include 6 volts or substantially 6 volts. As described, the controller 112 is configured to receive or measure, from the thermal sensing device 306, a temperature measurement before power is supplied to the IC 302 (e.g., the initial temperature). The controller 112 may then supply the power, using the power source 310, to the high side of the IC 302 and, after the predetermined period, the controller 112 receives or measures another temperature measurement from the thermal sensing device 306 (e.g., the subsequent temperature).

Figure 4:
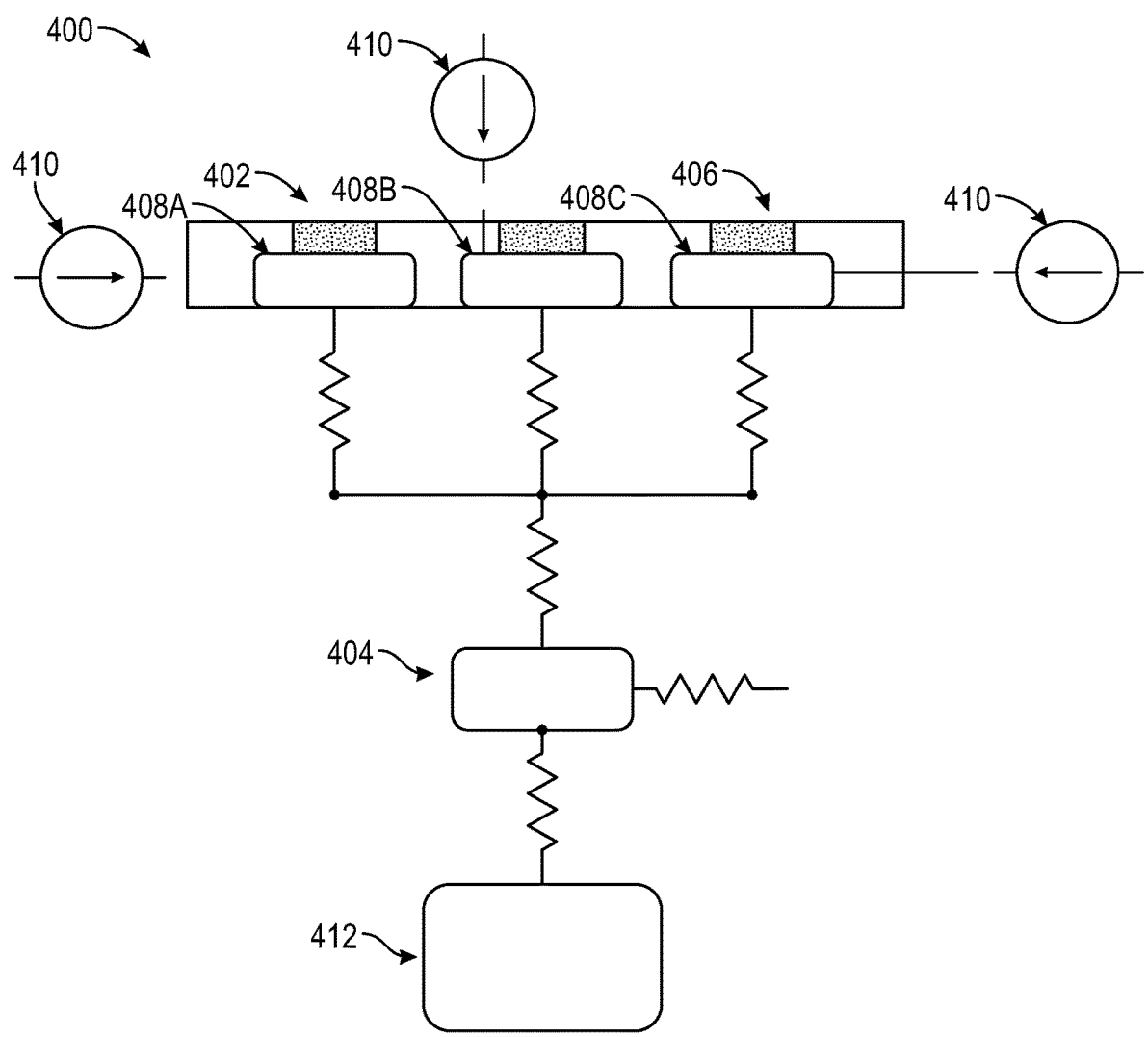
FIG. 4 generally illustrates a schematic of a printed circuit board assembly according to the principles of the present disclosure.

FIG. 4 generally illustrates a schematic of a printed circuit board assembly (PCBA) 400 according to the principles of the present disclosure. The PCBA 400 may include features similar to those of the PCBA 100, as described. For example, the PCBA 400 includes an IC 402 and a PCB 404. The IC 402 may include features similar to those described with respect to any of the ICs described herein. For example, the IC 402 includes a plurality of thermal sensing devices 406 disposed proximate respective heat zones 408A-408C. While the IC 402 is illustrated having heat zones 408A-408C, it should be understood that the IC 402 may include any suitable number of heat zones and any suitable number of corresponding thermal sensing devices. The IC 402 may be configured according to the first circuit design type, the second circuit design type, or any suitable circuit design type. Accordingly, any of the heat application modes described herein may be used to apply heat to the IC 402.

The PCB 404 may include features similar to those described with respect to any of the PCBs described herein. The PCBA 400 includes a plurality of power sources 410. The power sources 410 may include features similar to those described with respect to any of the power sources described herein. In some embodiments, the PCBA 400 includes a PCBA housing 412 configured to house or enclose the IC 402 and/or the PCB 404. In some embodiments, a controller, such as the controller 112 may be housed within the PCBA housing 412 and/or disposed external to the PCBA housing 412.

As described, the controller 112 may follow one of a plurality of temperature monitoring strategies when characterizing the IC 402 and/or during manufacturing of PCBAs having ICs with a similar circuit design type as the IC 402 to determine whether thermal paths associated with the IC 402 are sufficient. In some embodiments, a first temperature monitoring strategy includes applying heat, according to a selected heat application mode, to each of the thermal sensing devices 406 simultaneously or substantially simultaneously. For example, the controller 112 may receive or measure an initial temperature measurement from each of the thermal sensing devices 406. The controller 112 supplies power, using each of the power sources 410, to each of the thermal sensing devices 406, according to the selected heat application mode, at the same time. The controller 112 may then receive or measure temperature measurements (e.g., subsequent temperature measurements) from one of the thermal sensing devices 406. The controller 112 may determine a delta temperature for the thermal sensing device 406. The controller 112 may then store the initial temperatures, the subsequent temperature, and the delta temperature in a register associated with the IC 402 and/or ICs having a similar circuit design as the IC 402. Additionally, or alternatively, the controller 112 may define and store thermal relationships of the IC 402, as described.

During manufacturing of the PCBAs having ICs with a similar circuit design as the IC 402, the controller 112 may receive or measure an initial temperature measurement from each of the thermal sensing devices associated with an IC. The controller 112 supplies power, using each of the power sources associated with the IC, to each of the thermal sensing devices associated with the IC, according to the selected heat application mode, at the same time. The controller 112 may then receive or measure temperature measurements (e.g., subsequent temperature measurements) from one of the thermal sensing devices associated with the IC. The controller 112 may determine a delta temperature for the thermal sensing device. The controller 112 may retrieve, from a register associated with the IC, the expected delta temperature. The controller 112 may then compare the delta temperature for the thermal sensing device to the expected temperature and determine whether thermal paths proximate to the heat zone associated with the thermal sensing device are sufficient based on the comparison, as described.

In some embodiments, a second temperature monitoring strategy includes applying heat, according to a selected heat application mode, to each of the thermal sensing devices 406 simultaneously or substantially simultaneously, as described. The controller 112 may then receive or measure temperature measurements (e.g., subsequent temperature measurements) from each of the thermal sensing devices 406. The controller 112 may determine a delta temperature for each of the thermal sensing devices 406. The controller 112 may then store the initial temperatures, the subsequent temperatures, and the delta temperatures in a register associated with the IC 402 and/or ICs having a similar circuit design as the IC 402. Additionally, or alternatively, the controller 112 may define and store thermal relationships of the IC 402, as described.

During manufacturing of the PCBAs having ICs with a similar circuit design as the IC 402, the controller 112 may receive or measure an initial temperature measurement from each of the thermal sensing devices associated with an IC. The controller 112 supplies power, using each of the power sources associated with the IC, to each of the thermal sensing devices associated with the IC, according to the selected heat application mode, at the same time. The controller 112 may then receive or measure temperature measurements (e.g., subsequent temperature measurements) from each of the thermal sensing devices associated with the IC. The controller 112 may determine delta temperatures for each of the thermal sensing devices. The controller 112 may retrieve, from a register associated with the IC, the expected delta temperatures corresponding to each of the thermal sensing devices and compare the delta temperatures for each respective thermal sensing device to the expected temperature corresponding to the respective thermal sensing device. The controller 112 may determine whether thermal paths proximate to the heat zone associated with the thermal sensing device are sufficient based on the comparison, as described.

In some embodiments, a third temperature monitoring strategy includes applying heat, according to a selected heat application mode, to one of the thermal sensing devices 406. For example, the controller 112 may receive or measure an initial temperature measurement from one or all of the thermal sensing devices 406. The controller 112 supplies power, using one of the power sources 410, to one of the thermal sensing devices 406, according to the selected heat application mode. The controller 112 may then receive or measure temperature measurements (e.g., subsequent temperature measurements) from the thermal sensing device 406. The controller 112 may determine a delta temperature for the thermal sensing device 406. The controller 112 may then store the initial temperatures, the subsequent temperature, and the delta temperature in a register associated with the IC 402 and/or ICs having a similar circuit design as the IC 402. Additionally, or alternatively, the controller 112 may define and store thermal relationships of the IC 402, as described.

During manufacturing of the PCBAs having ICs with a similar circuit design as the IC 402, the controller 112 may receive or measure an initial temperature measurement from one or all of the thermal sensing devices associated with an IC. The controller 112 supplies power, using one of the power sources associated with the IC, to one of the thermal sensing devices associated with the IC, according to the selected heat application mode. The controller 112 may then receive or measure temperature measurements (e.g., subsequent temperature measurements) from the thermal sensing device associated with the IC. The controller 112 may determine a delta temperature for the thermal sensing device. The controller 112 may retrieve, from a register associated with the IC, the expected delta temperature. The controller 112 may then compare the delta temperature for the thermal sensing device to the expected temperature and determine whether thermal paths proximate to the heat zone associated with the thermal sensing device are sufficient based on the comparison, as described.

In some embodiments, a fourth temperature monitoring strategy includes applying heat, according to a selected heat application mode, to each of the thermal sensing devices 406, individually. For example, the controller 112 may receive or measure an initial temperature measurement from each of the thermal sensing devices 406. The controller 112 supplies power, using one of the power sources 410, to a first thermal sensing device 406, according to the selected heat application mode. The controller 112 may then receive or measure temperature measurements (e.g., subsequent temperature measurements) from the first thermal sensing device 406. The controller 112 may determine a first delta temperature for the first thermal sensing device 406. The controller 112 may then store the initial temperatures, the subsequent temperature, and the first delta temperature in a register associated with the IC 402 and/or ICs having a similar circuit design as the IC 402.

The controller 112 supplies power, using another of the power sources 410, to a second thermal sensing device 406, according to the selected heat application mode. The controller 112 may then receive or measure temperature measurements (e.g., subsequent temperature measurements) from the second thermal sensing device 406. The controller 112 may determine a second delta temperature for the second thermal sensing device 406. The controller 112 may then store the initial temperatures, the subsequent temperature, and the second delta temperature in a register associated with the IC 402 and/or ICs having a similar circuit design as the IC 402. The controller 112 may continue for each of the thermal sensing devices 406 of the IC 402. Additionally, or alternatively, the controller 112 may define and store thermal relationships of the IC 402, as described.

During manufacturing of the PCBAs having ICs with a similar circuit design as the IC 402, the controller 112 may receive or measure an initial temperature measurement from each of the thermal sensing devices associated with an IC. The controller 112 supplies power, using one of the power sources associated with the IC, to a first thermal sensing device associated with the IC, according to the selected heat application mode. The controller 112 may then receive or measure temperature measurements (e.g., subsequent temperature measurements) from the first thermal sensing device associated with the IC. The controller 112 may determine a first delta temperature for the thermal sensing device. The controller 112 may retrieve, from a register associated with the IC, the first expected delta temperature. The controller 112 may then compare the first delta temperature for the first thermal sensing device to the first expected temperature and determine whether thermal paths proximate to the heat zone associated with the first thermal sensing device are sufficient based on the comparison, as described. The controller 112 may continue for each of the thermal sensing devices associated with the ICs having a circuit design type similar to the IC 402.

In some embodiments, during manufacturing of the PCBAs having ICs with a similar circuit design as the IC 402, the controller 112 may receive or measure an initial temperature measurement from each of the thermal sensing devices associated with an IC. The controller 112 supplies power, using one of the power sources associated with the IC, to a first thermal sensing device associated with the IC, according to the selected heat application mode. The controller 112 may then receive or measure temperature measurements (e.g., subsequent temperature measurements) from the first thermal sensing device associated with the IC. The controller 112 may determine a first delta temperature for the thermal sensing device.

The controller 112 may then supply power, using another of the power sources associated with the IC, to a second thermal sensing device associated with the IC, according to the selected heat application mode. The controller 112 may then receive or measure temperature measurements (e.g., subsequent temperature measurements) from the second thermal sensing device associated with the IC. The controller 112 may determine a second delta temperature for the thermal sensing device. The controller 112 may continue for each of the thermal sensing devices associated with the IC. The controller 112 may compare each of the first delta temperature, the second delta temperature, and other delta temperatures of the IC. The controller 112 may determine thermal paths proximate to one or more heat zones of the IC are insufficient, based on the comparison. For example, the controller 112 may determine that one of the delta temperatures associated with one of the thermal sensing devices is outside of a range of the other delta temperatures. The controller 112 may determine that the delta temperature outside of the range of the other delta temperatures indicates insufficient thermal paths proximate to the heat zone associated with the thermal sensing device having the delta temperature outside the range of the other delta temperatures. It should be understood that while only limited examples are described herein, the principles of the present disclose apply to any suitable temperature monitoring strategy other than those described herein. Additionally, or alternatively, the controller 112 may apply heat, according to a heat application mode, to one, some, or all of the thermal sensing devices in any suitable order. The controller 112 may use the same power source to supply power, according to the heat application mode to one, some, or all of the thermal sensing devices and/or the controller 112 may use different power sources.

In some embodiments, the controller 112 may perform the methods described herein. However, the methods described herein as performed by the controller 112 are not meant to be limiting, and any type of software executed on a controller can perform the methods described herein without departing from the scope of this disclosure. For example, a controller, such as a processor executing software within a computing device onboard the PCBAs 100,400 or external to the PCBAs 100,400, can perform the methods described herein.

Figure 6:
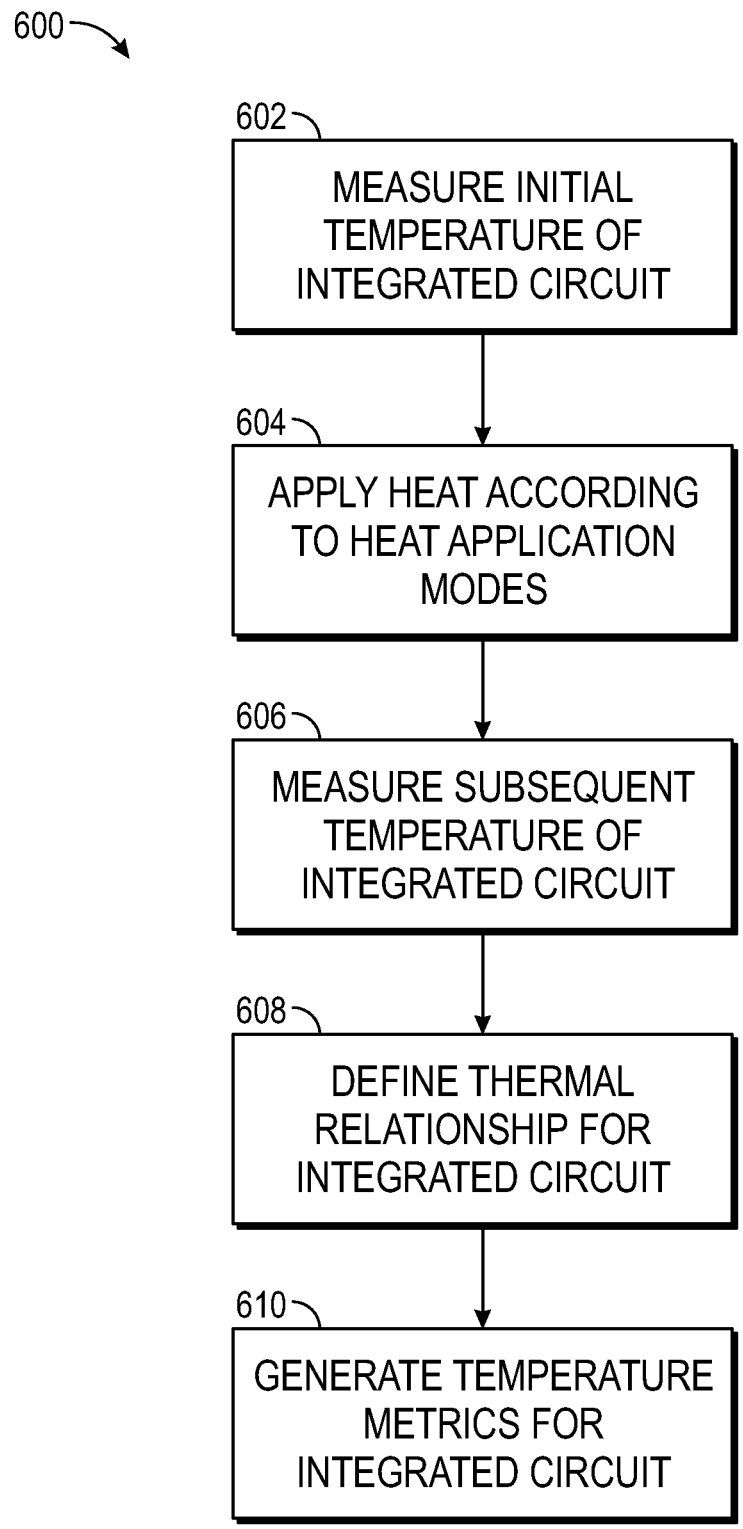
FIG. 6 is a flow diagram generally illustrating an integrated circuit characterization method according to the principles of the present disclosure.

FIG. 6 is a flow diagram generally illustrating an integrated circuit characterization method 600 according to the principles of the present disclosure. At 602, the method 600 measures an initial temperature of an integrated circuit. As described, the controller 112 may receive or measure initial temperatures for one or all of the thermal sensing devices 406 of the IC 402. At 604, the method 600 applies heat according to a heat application mode. As described, the controller 112 may apply heat to one or more of the thermal sensing devices 406 according to a selected heat application mode using one or more of the power sources 410. At 606, the method 600 measures subsequent temperatures of the integrated circuit. As described, the controller 112 may receive or measure subsequent temperatures of the one or more thermal sensing devices 406 after a predetermined period. The controller 112 determines one or more expected delta temperatures, according to the temperature monitoring strategy, as described.

At 608, the method 600 determines thermal relationships for the integrated circuit. As described, the controller 112 may define a relationship between the expected delta temperature(s), the selected heat application mode, an arrangement of the thermal sensing devices 406 relative to the heat zones 408, and the temperature monitoring strategy. At 610, the method 600 generates temperature metrics for the integrated circuit. As described, the controller 112 may store the initial temperatures, the subsequent temperatures, the delta temperatures, and the relationship definition in registers associated with the IC 402 and/or ICs having a similar circuit design type as the IC 402.

Figure 7:
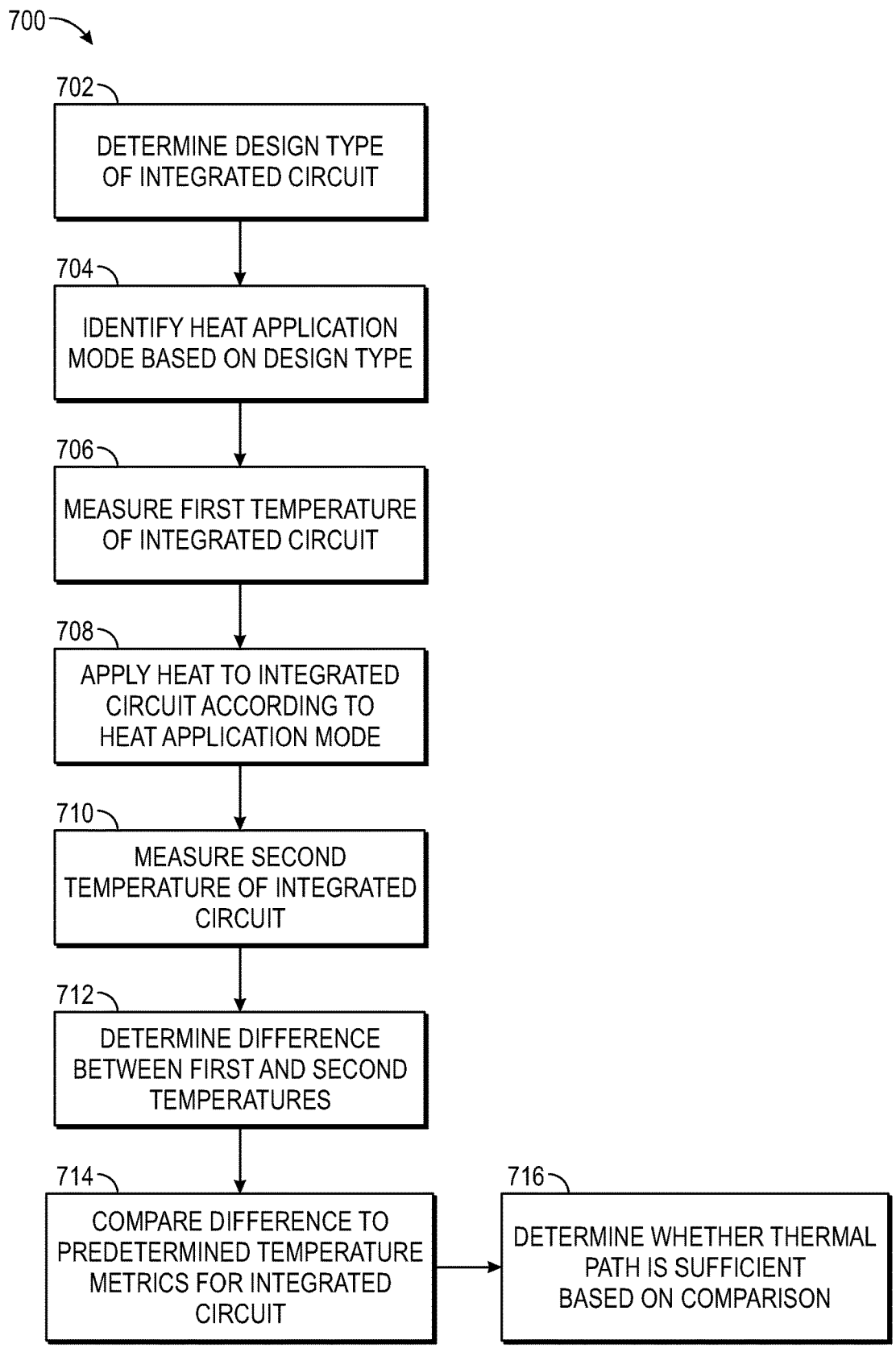
FIG. 7 is a flow diagram generally illustrating a multi-point assessment method according to the principles of the present disclosure.

FIG. 7 is a flow diagram generally illustrating a multipoint assessment method 700 according to the principles of the present disclosure. At 702, the method 700 determines a design type for an integrated circuit. For example, during manufacturing of PCBAs, the controller 112 may determine a circuit design type for the ICs. The controller 112 may identify, or retrieve from a register, temperature metrics associated with the circuit design type. In some embodiments, the temperature metrics associated with the circuit design type may be stored in registers associated with the ICs. Accordingly, the controller 112 may omit determining the circuit design type and may instead retrieve the temperature metrics from the registers. At 704, the method 700 identifies a heat application mode based on the design type. The controller 112 may determine the heat application mode based on the thermal relationship information stored in the registers (e.g., with the temperature metrics). At 706, the method 700 measures a first temperature of the integrated circuit. As described, the controller 112 may measure an initial temperature for one or all of the thermal sensing devices associated with an IC being manufactured according to the temperature monitoring strategy.

At 708, the method 700 applies heat to the integrated circuit according to a heat application mode. As described, the controller 112 applies heat, using one or more power sources associated with the IC, to one or more thermal sensing devices of the IC, according to a heat application mode identified based on the circuit design type and/or stored in the register associated with the IC. At 710, the method 700 measures second temperatures of the integrated circuit. As described, the controller 112 receives or measures a subsequent temperature for the one or more thermal sensing devices, according to the temperature monitoring strategy. At 712, the method 700 determines a difference between the first temperature the second temperature. As described, the controller 112 determines a delta temperature for the one or more thermal sensing devices by determining a difference between the initial temperature of the one or more thermal sensing devices and the subsequent temperature of the one or more thermal sensing devices. At 714, the method 700 compares the difference to predetermined temperature metrics for the integrated circuit. As described, the controller 112 compares the delta temperature for the one or more thermal sensing devices to a corresponding expected delta temperature stored in the register associated with the IC. At 716, the method 700 determines whether thermal path is sufficient based on the comparison. As described, the controller 112 may determine whether thermal path associated with a heat zone corresponding to the one or more thermal sensing devices is sufficient based on the comparison between the delta temperature and the expected delta temperature.

In some embodiments, the method 700, as described, may be performed, using the controller 112, at in-circuit testing or middle of the line testing (e.g., on the IC and PCB prior to a pedestal and/or housing being assembled within the associated PCBA) and then again at end of the line testing. For example, the controller 112 may determine, by performing the method 700, whether solder connections (e.g., of the thermal path) between the IC and the PCB are sufficient. For example, if the controller 112 determines delta temperature is within the predetermined range of the expected delta temperature, the controller 112 determines that the solder connections between the IC and the PCB are sufficient. The associated PCBA may then continue through the manufacturing process. Conversely, if the controller 112 determines the delta temperature is outside of the predetermined range of the expected temperature, the controller 112 determines that solder connections between the IC and the PCB are intermediate or insufficient. The solder connections between the IC and the PCB may be repaired before the PCBA continues through the manufacturing process.

During end of line testing, the controller 112 may determine, by performing the method 700, whether the thermal interface (e.g., of the thermal path) between the PCB and the pedestal or the housing is sufficient. For example, if the controller 112 determines that the delta temperature is within the predetermined range of the expected delta temperature, the controller 112 determines that the thermal interface between the PCB and the pedestal or the housing is sufficient. Additionally, or alternatively, the controller 112 determines, based on the determination that the delta temperature is within the predetermined range of the expected delta temperature, that the thermal path of the PCBA is sufficient (e.g., because the solder connections between the IC and the PCB were previously determined to be sufficient).

Conversely, during end of line testing, if the controller 112 determines that the delta temperature is outside of the predetermined range of the expected delta temperature, the controller 112 determines that the thermal interface between the PCB and the pedestal or the housing is intermediate or insufficient. The PCBA may be scrapped or the thermal interface may be repaired based on the determination that the thermal interface between the PCB and the pedestal is intermediate or insufficient.

In some embodiments, the method 700, as described, may be performed, using the controller 112, at in-circuit testing or middle of the line testing (e.g., on the IC and PCB prior to a pedestal and/or housing being assembled within the associated PCBA). For example, the controller 112 may determine, by performing the method 700, whether solder connections (e.g., of the thermal path) between the IC and the PCB are sufficient. For example, if the controller 112 determines delta temperature is within the predetermined range of the expected delta temperature, the controller 112 determines that the solder connections between the IC and the PCB are sufficient. The associated PCBA may then continue through the manufacturing process. Conversely, if the controller 112 determines the delta temperature is outside of the predetermined range of the expected temperature, the controller 112 determines that solder connections between the IC and the PCB are intermediate or insufficient. The solder connections between the IC and the PCB may be repaired before the PCBA continues through the manufacturing process. Thermal paths of the PCBA during finally assembly of the PCBA (e.g., including the pedestal and housing) may be assumed to be sufficient based on a determination that the solder connections between the IC and the PCB are sufficient.

In some embodiments, the method 700, as described, may be performed, using the controller 112, at end of the line testing. For example, the controller 112 may determine, by performing the method 700, whether the any portion of the thermal path (e.g., solder connections between the IC and the PCB, the thermal interface between the PCB and the pedestal, and/or other thermal interfaces or connections of the PCBA) is sufficient. For example, if the controller 112 determines that the delta temperature is within the predetermined range of the expected delta temperature, the controller 112 determines that the thermal path is sufficient. Conversely, if the controller 112 determines that the delta temperature is outside of the predetermined range of the expected delta temperature, the controller 112 determines that at least one portion of the thermal path is intermediate or insufficient. The PCBA may be scrapped, as repair may be difficult or impossible without knowing which portion of the thermal path is intermediate or insufficient.

In some embodiments, the method 700, as described, may be performed, using the controller 112, during assembled unit testing. For example, the controller 112 may determine, by performing the method 700, whether the any portion of the thermal path (e.g., solder connections between the IC and the PCB, the thermal interface between the PCB and the pedestal or the housing, and/or other thermal interfaces or connections of the PCBA) is sufficient. For example, if the controller 112 determines that the delta temperature is within the predetermined range of the expected delta temperature, the controller 112 determines that the thermal path is sufficient. Conversely, if the controller 112 determines that the delta temperature is outside of the predetermined range of the expected delta temperature, the controller 112 determines that at least one portion of the thermal path is intermediate or insufficient. The PCBA may be scrapped, as repair may be difficult or impossible without knowing which portion of the thermal path is intermediate or insufficient. Assembled unit testing results may be used during engineering debugging of initial PCBAs (e.g., during characterization, as described) to verify good components.

In some embodiments, a method for assessing a thermal path associated with an integrated circuit includes identifying a heat application mode based on a design type of the integrated circuit. The method also includes measuring a first temperature of at least one thermal sensing device associated with the integrated circuit. The method also includes applying heat to at least a portion of the integrated circuit according to the heat application mode. The method also includes measuring a second temperature of the at least one thermal sensing device associated with the integrated circuit. The method also includes determining a difference between the first temperature and the second temperature. The method also includes determining whether a thermal path between the integrated circuit and an associated substrate is sufficient based on a comparison of the difference between the first temperature and the second temperature with a predetermined difference between an initial temperature and a subsequent temperature of the at least one thermal sensing device.

In some embodiments, the heat application mode includes at least one of a first test mode, a second test mode, and a normal operation mode. In some embodiments, the first test mode includes a low error-heating mode. In some embodiments, the second test mode includes a current limit mode. In some embodiments, the normal operation mode corresponds to normal operating characteristics of the integrated circuit. In some embodiments, the initial temperature corresponds to a baseline temperature of the design type corresponding to the integrated circuit at a time prior to heat being applied. In some embodiments, the subsequent temperature corresponds to a temperature of the design type corresponding to the integrated circuit at a time after heat is applied.

In some embodiments, an integrated thermal path assessment system includes an integrated circuit, at least one thermal sensing device, and a controller. The integrated circuit is thermally attached to at least one substrate of a printed circuit board. The at least one thermal sensing device is associated with the integrated circuit. The controller is in communication with the integrated circuit and configured to: identify a heat application mode based on a design type of the integrated circuit; measure a first temperature of at least one thermal sensing device associated with the integrated circuit; apply heat to at least a portion of the integrated circuit according to the heat application mode; measure a second temperature of the at least one thermal sensing device associated with the integrated circuit; determine a difference between the first temperature and the second temperature; and determine whether a thermal path associated with the integrated circuit is sufficient based on a comparison of the difference between the first temperature and the second temperature with a predetermined difference between an initial temperature and a subsequent temperature of the at least one thermal sensing device.

In some embodiments, the thermal path includes at least one of a solder connect between the IC and the at least one substrate of the printed circuit board and a thermal interface between the printed circuit board and an associated pedestal. In some embodiments, the heat application mode includes a low error-heating mode. In some embodiments, the heat application mode includes a current limit mode. In some embodiments, the heat application mode corresponds to normal operating characteristics of the integrated circuit. In some embodiments, the initial temperature corresponds to a baseline temperature of the design type corresponding to the integrated circuit at a time prior to heat being applied. In some embodiments, the subsequent temperature corresponds to a temperature of the design type corresponding to the integrated circuit at a time after heat is applied.

In some embodiments, a method for characterizing a first integrated circuit includes measuring an initial temperature of at least a portion of the first integrated circuit. The method also includes applying heat to at least a portion of the first integrated circuit according to at least one heat application mode of a plurality of heat application modes. The method also includes measuring a subsequent temperature of the portion of the first integrated circuit. The method also includes defining a thermal relationship for at least one thermal path between the first integrated circuit and a substrate of a printed circuit board, a location of at least one thermal sensing device on the first integrated circuit, and at least one heat application mode of the plurality of heat application modes.

In some embodiments, the plurality of heat application modes includes at least one of a first test mode, a second test mode, and a normal operation mode. In some embodiments, the first test mode includes a low error-heating mode. In some embodiments, the second test mode includes a current limit application mode. In some embodiments, the normal operation mode corresponds to normal operating characteristics of the first integrated circuit. In some embodiments, at least one of the initial temperature and the subsequent temperature is stored in a register on integrated circuits having a design type corresponding to the first integrated circuit.

Another aspect of the disclosed embodiments is a thermal path assessment system. The system includes an integrated circuit, at least one thermal sensing device, a case or heat sink, and a controller. The integrated circuit is thermally attached to at least one substrate of the printed circuit board. The printed circuit board is attached to the case or heat sink with thermal glue or other thermally conductive material. The at least one thermal sensing device is associated with the integrated circuit. The controller is in communication with the integrated circuit and configured to: identify a heat application mode based on a design type of the integrated circuit; measure a first temperature of at least one thermal sensing device associated with the integrated circuit; apply heat to at least a portion of the integrated circuit according to the heat application mode; measure a second temperature of at least one thermal sensing device associated with the integrated circuit; determine a difference between the first temperature and the second temperature; and determine whether the thermal path between the integrated circuit and an associated case or heat sink is sufficient based on a comparison of the difference between the first temperature and the second temperature with a predetermined difference between an initial temperature and a subsequent temperature of at least one thermal sensing device.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations of the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for assessing a thermal path associated with an integrated circuit, the method comprising:
    identifying a heat application mode based on a design type of the integrated circuit;
    measuring a first temperature of at least one thermal sensing device associated with the integrated circuit;
    applying heat to at least a portion of the integrated circuit according to the heat application mode;
    measuring a second temperature of the at least one thermal sensing device associated with the integrated circuit;

determining a difference between the first temperature and the second temperature;

determining whether a thermal path between the integrated circuit and an associated substrate is sufficient based on a comparison of the difference between the first temperature and the second temperature with a predetermined difference between an initial temperature and a subsequent temperature of the at least one thermal sensing device;

storing the difference as a delta temperature; and characterizing a type of the integrated circuit based on the stored delta temperature and the predetermined difference.

2. The method of claim 1, wherein the heat application mode includes at least one of a first test mode, a second test mode, and a normal operation mode.

3. The method of claim 2, wherein the first test mode includes a low error-heating mode.

4. The method of claim 2, wherein the second test mode includes a current limit mode.

5. The method of claim 2, wherein the normal operation mode corresponds to normal operating characteristics of the integrated circuit.

6. The method of claim 1, wherein the initial temperature corresponds to a baseline temperature of the design type corresponding to the integrated circuit at a time prior to heat being applied.

7. The method of claim 1, wherein the subsequent temperature corresponds to a temperature of the design type corresponding to the integrated circuit at a time after heat is applied.

8. An integrated circuit thermal path assessment system, comprising:

an integrated circuit configured to be thermally attached to at least one substrate of a printed circuit board;

at least one thermal sensing device associated with the integrated circuit; and a controller configured to be in communication with the integrated circuit, the controller configured to:

identify a heat application mode based on a design type of the integrated circuit;

measure a first temperature of at least one thermal sensing device associated with the integrated circuit;

apply heat to at least a portion of the integrated circuit according to the heat application mode;

measure a second temperature of the at least one thermal sensing device associated with the integrated circuit;

determine a difference between the first temperature and the second temperature;

determine whether a thermal path associated with the integrated circuit is sufficient based on a comparison of the difference between the first temperature and the second temperature with a predetermined difference between an initial temperature and a subsequent temperature of the at least one thermal sensing device;

store the difference as a delta temperature; and characterize a type of the integrated circuit based on the stored delta temperature and the predetermined difference.

9. The system of claim 8, wherein the thermal path includes at least one of a solder connect between the integrated circuit and the at least one substrate of the printed circuit board and a thermal interface between the printed circuit board and an associated pedestal.

10. The system of claim 8, wherein the heat application mode includes a low error-heating mode.

11. The system of claim 8, wherein the heat application mode includes a current limit mode.

12. The system of claim 8, wherein the heat application mode corresponds to normal operating characteristics of the integrated circuit.

13. The system of claim 8, wherein the initial temperature corresponds to a baseline temperature of the design type corresponding to the integrated circuit at a time prior to heat being applied.

14. The system of claim 8, wherein the subsequent temperature corresponds to a temperature of the design type corresponding to the integrated circuit at a time after heat is applied.

15. A method for characterizing a first integrated circuit, the method comprising:

measuring an initial temperature of at least a portion of the first integrated circuit;

applying heat to at least a portion of the first integrated circuit according to at least one heat application mode of a plurality of heat application modes;

measuring a subsequent temperature of the portion of the first integrated circuit;

defining a thermal relationship of at least one thermal path between the first integrated circuit and a substrate of a printed circuit board, a location of at least one thermal sensing device on the first integrated circuit, and the at least one heat application mode of the plurality of heat application modes;

storing a difference between the initial temperature and the subsequent temperature as a delta temperature; and characterizing a type of the first integrated circuit based on the stored delta temperature and a predetermined difference between an initial temperature and a subsequent temperature of the portion of the first integrated circuit.

16. The method of claim 15, wherein the plurality of heat application modes includes at least one of a first test mode, a second test mode, and a normal operation mode.

17. The method of claim 16, wherein the first test mode includes a low error-heating mode.

18. The method of claim 16, wherein the second test mode includes a current limit mode.

19. The method of claim 16, wherein the normal operation mode corresponds to normal operating characteristics of the first integrated circuit.

20. The method of claim 15, wherein at least one of the initial temperature and the subsequent temperature is stored in a register on integrated circuits having a design type corresponding to the first integrated circuit.

* * * * *